United States Patent
Tomohiro et al.

(10) Patent No.: US 6,521,166 B1
(45) Date of Patent: Feb. 18, 2003

(54) METHOD OF POLARIZATION-TREATING PIEZOELECTRIC BODY

(75) Inventors: Hiroshi Tomohiro, Shiga-ken (JP); Naoki Fujii, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 82 days.

(21) Appl. No.: 09/637,715

(22) Filed: Aug. 11, 2000

(30) Foreign Application Priority Data

Aug. 13, 1999 (JP) ............................................ 11-228954

(51) Int. Cl.$^7$ ........................... B28B 11/00; G01R 29/22
(52) U.S. Cl. ........................ 264/408; 264/430; 264/436; 324/727
(58) Field of Search ............................... 264/40.1, 408, 264/430, 436; 324/727

(56) References Cited

U.S. PATENT DOCUMENTS

| | | |
|---|---|---|
| 4,611,260 A | 9/1986 | Bauer |
| 5,426,374 A * | 6/1995 | Taka et al. .................. 324/727 |
| 5,543,106 A * | 8/1996 | Nakashima ................. 264/430 |

FOREIGN PATENT DOCUMENTS

JP 2656041 B2 5/1997

OTHER PUBLICATIONS

Japanese Application No. 01012587, Patent Abstracts of Japan, Yamashita Yoshinari et al., TDK Corp., Date of Publication Jan. 1989, "Method and Apparatus for Polarizing Piezoelectric Porcelain".

Japanese Application No. 64002383, Patent Abstracts of Japan, Fukuhara Shuichi et al., Toko Inc., Date of Publication Jan. 1989, "Manufacture of Piezoelectric Porcelain".

Bernard Jaffe et al., "Piezoelectric Ceramics", 1971, Academic Press London and New York, pp. 262–267.

* cited by examiner

Primary Examiner—Leo B. Tentoni
(74) Attorney, Agent, or Firm—Keating & Bennett, LLP

(57) ABSTRACT

A DC voltage is applied to a piezoelectric body for polarization treatment in the air and in an atmosphere with a temperature equal to or higher than an aging temperature, and then, the piezoelectric body is aged at the aging temperature. The polarization degree is determined based on the frequency characteristic while the piezoelectric body is polarized. The application of the DC voltage is stopped at the time when the measured polarization degree reaches a set level. The set level is determined based on a correlation between the polarization degree obtained immediately before the application of the DC voltage is stopped and the stable polarization degree obtained after the aging and the ordinary temperature restoration following the stop of the voltage application.

17 Claims, 4 Drawing Sheets

METHOD OF POLARIZATION-TREATING PIEZOELECTRIC BODY

BACKGROUND OF THE INVENTION

1. Field of the Invention

The present invention relates to a method of polarization-treating a piezoelectric body for use in a ceramic filter, a ceramic oscillator, and other suitable components.

2. Description of the Related Art

For polarization-treatment of piezoelectric ceramic substrates (block, unit, or other suitable substrates) of PZT and PT types, conventionally, after a piezoelectric ceramic substrate is fired, electrodes made of Ag or other suitable materials are provided on both of the opposite sides of the piezoelectric ceramic substrate. Plural piezoelectric ceramic substrates are simultaneously dipped into a polarization liquid at a temperature of 60 to 100° C., and a voltage of 2 to 8 kV/mm is applied for about 10 to 30 minutes to obtain a desired polarization degree.

After the polarization treatment, to prevent the deterioration of characteristics caused by heat treatment as an after-process, the piezoelectric body is left to stand still in an atmosphere at about 150° C. for 20 to 30 minutes (aging), so that the characteristics of the piezoelectric body are caused to deteriorate, and thereby, the time-dependent characteristics of the piezoelectric body are stabilized.

The polarization treatment of a piezoelectric body can be done by the in-liquid polarization which is carried out in a polarization liquid having insulation properties as described above, and the in-air polarization which is conducted in the atmosphere or in an gas atmosphere. In the in-air polarization, a desired electric field intensity cannot be attained because discharge occurs at a voltage of about at least 1 kV/mm. For this reason, in general, the in-liquid polarization is used to obtain a high polarization degree.

However, in the case of the in-liquid polarization, the polarization degree of the piezoelectric body cannot be measured during polarization. This is because the vibration of the piezoelectric body placed in the liquid is damped due to the liquid, and the frequency characteristic cannot be measured. For this reason, conventionally, the in-liquid polarization is the constant-time polarization in which the polarization is carried out for a desired time period. As a result, a problem arises in that the polarization degree cannot be exactly controlled, causing the firing and composition of the piezoelectric body to be dispersed, which results in dispersion of the polarization degree.

In Japanese Patent No. 2656041, a polarization method proposed is in which a piezoelectric constant (for example, electromechanical coupling coefficient K) is measured during polarization, and application of a voltage is stopped when the constant reaches the desired level which is determined by a correlation between the value K obtained immediately after the polarization is stopped and the stable value K obtained after a lapse of time. As a result, dispersion of the polarization degree caused by dispersion of materials and firing conditions is reduced. Accordingly, a piezoelectric body having constant qualities is produced.

According to the above-described method, the piezoelectric constant value is measured during polarization. Accordingly, it is necessary to carry out the polarization treatment in the air. However, in the in-air polarization, discharge occurs at a voltage of about at least 1 kV/mm, so that a high voltage cannot be applied. This causes the problem that a long polarization treatment time is needed to obtain a polarization degree comparable to that by the in-liquid polarization.

Moreover, according to the above-described method, the set level is determined based on the correlation between the value of K obtained immediately after the polarization is stopped and the stable value of K obtained after a lapse of time. However, if the piezoelectric body is aged after the polarization treatment, the polarization degree varies with the value of K. For this reason, if the aging is carried out after the polarization treatment, the set level cannot be determined based on the correlation between the value of K obtained immediately after the polarization is stopped and the stable value of K obtained after a lapse of time.

SUMMARY OF THE INVENTION

To overcome the problems described above, preferred embodiments of the present invention provide a method of polarization-treating a piezoelectric body in which a polarization degree comparable to that obtained by in-liquid polarization is obtained in a short period of time by in-air polarization.

Preferred embodiments of the present invention also provide a method of polarization-treating a piezoelectric body in which dispersion of the polarization degrees of respective piezoelectric bodies is reduced, and a target polarization degree is very precisely attained.

According to a first preferred embodiment of the present invention, a method of polarization-treating a piezoelectric body includes the steps of applying a DC voltage to the piezoelectric body for polarization in the air and in an atmosphere with a temperature at least as high as an aging temperature, measuring a polarization degree of the piezoelectric body while the piezoelectric body is polarized, stopping the application of the DC voltage at the time when the measured polarization degree reaches a set level, and aging the piezoelectric body at the aging temperature after the application of the voltage is stopped.

In the case of polarization treatment in the air, a voltage of about at least 1 kV/mm cannot be applied. However, a piezoelectric body can be polarization-treated at a higher temperature as compared with the polarization in a liquid. Accordingly, the polarization is conducted at a low voltage, and a desired polarization degree is attained in a short time. Moreover, since the aging of the piezoelectric body proceeds simultaneously with the polarization, the aging time after the application of the voltage is stopped is substantially shortened. For example, conventionally, for aging in an atmosphere at about 150° C., an aging time of about 20 to 30 minutes is required. According to preferred embodiments of the present invention, the aging is performed in only several minutes. That is, the aging time is reduced to about one tenth of the conventional aging time. Consequently, the polarization time and the aging time are greatly shortened. Thus, the overall time required for the polarization treatment is significantly reduced.

Further, the polarization is performed at a relatively low voltage. Therefore, a charge to the piezoelectric body is reduced, and problems such as cracking, chipping, and other common problems, which are caused by the polarization, are eliminated.

As the piezoelectric body is polarized in the air, the frequency characteristic is measured during the polarization. That is, the polarization degree is easily measured. With the polarization degree being measured, the application of the voltage is stopped at the time when the measured polarization degree reaches a set level, and after the application of the voltage is stopped, the piezoelectric body is aged at an aging temperature. Therefore, dispersion of the polarization degree is greatly reduced, and a target polarization degree is very precisely attained. The set level is a value that is determined depending on piezoelectric materials. Further, the set value may be a value determined corresponding to polarization conditions such as polarization temperature, polarization voltage, and other conditions.

FIG. 1 shows the variation of the polarization degree of a piezoelectric body in the process of polarization to aging to ordinary temperature restoration.

As seen in FIG. 1, the polarization degree rises to the maximum during the polarization, and is decreased by the aging, and then is partially restored by the ordinary temperature restoration to become stabilized. The maximum polarization degree $\Delta f_1$ in the polarization and the stable polarization degree obtained after the ordinary temperature restoration have a high correlation.

In the above example, the polarization degree of the piezoelectric body is determined based on the frequency difference $\Delta f$ between the resonance frequency fr and the anti-resonance frequency fa. A piezoelectric constant such as an electromechanical coupling coefficient K, a center frequency, or other suitable piezoelectric constant is used to determine the polarization degree.

FIG. 2 shows a correlation between the maximum polarization degree $\Delta f_1$ in the polarization and the stable polarization degree $\Delta f_2$ after the ordinary temperature restoration. The correlation was determined under the following conditions:

piezoelectric body: PZT block (thickness 8 mm)
polarization voltage (inter-electrode voltage):8.7 kV
polarization temperature: 200° C.
aging temperature: 200° C.

As seen in FIG. 2, $\Delta f_1$ and $\Delta f_2$ have a high correlation. In this example, $\Delta f_1$ and $\Delta f_2$ are proportional to each other.

Preferably, the set level for stopping the application of the DC voltage is determined according to preferred embodiments of to the present invention. In particular, the set level is determined based on a correlation between the polarization degree of the piezoelectric body obtained immediately before the application of the DC voltage is stopped, and the stable polarization degree of the piezoelectric body obtained after the application of the voltage is stopped so that the piezoelectric body is aged and the temperature of the piezoelectric body is restored to an ordinary temperature. The polarization degree during polarization and the polarization degree (called a residual polarization degree) after aging and ordinary temperature restoration have a high correlation as seen in FIG. 2. The polarization degree during the polarization is determined from a target residual polarization degree by utilization of the correlation. The application of the voltage is stopped at the time when the polarization degree during polarization reaches the calculated polarization degree.

According to the above method, the polarization degree is very precisely controlled to be a target, and dispersion of the polarization is greatly reduced.

According to a second preferred embodiment of the present invention, a method of polarization-treating a piezoelectric body is provided in which the polarization degree of the piezoelectric body is measured while the piezoelectric body is polarization-treated, variations of the polarization degree are expressed as a characteristic formula based on measured polarization degrees, the time required for the polarization degree expressed by the characteristic formula to reach a set level is calculated, and the application of the DC voltage is stopped at the time when the polarization time reaches the calculated time. That is, in the case where piezoelectric bodies have a constant composition, variations in the polarization degrees obtained after the polarization is conducted to some degree are substantially constant. Thus, the time required for a polarization degree to reach a set level is predicted by utilization of the variations. Therefore, the application of the voltage is stopped when the polarization time reaches the predicted time.

According to this method, the measurement of a polarization degree, the expression as a characteristic formula, the calculation of the time required to reach a set level, and other factors are carried out for the respective piezoelectric bodies as the polarization is being attained. In the method according to the second preferred embodiment of the present invention, only the polarization time at a time point near the completion of the polarization is measured, in contrast to the method according to the first preferred embodiment of the present invention in which the polarization degree at the completion of the polarization is measured. Therefore, advantageously, over-polarization, which will be caused by measurement lag, is prevented, and the polarization can be very precisely controlled.

If a thick piezoelectric ceramic substrate such as a block is polarized in a high temperature atmosphere, current flowing through the piezoelectric body is increased over time in some cases. Regarding the current increase, as the polarization proceeds, the internal orientation of the crystal proceeds in the electric field direction, and the insulation resistance of the piezoelectric body are reduced over time. The reduction of the insulation resistance causes the increase of the current value. The current increase during the polarization is presented more distinctly as the temperature increases. With increased current, a voltage drop is generated in the current limiting resistors which are provided for preventing over-current and are connected in series with the respective piezoelectric bodies, so that the voltages applied to the piezoelectric bodies are reduced. The reduction of the voltages causes problems in that the polarization rates of the piezoelectric bodies $W_1$ to $W_n$ are reduced, and a desired polarization degree cannot be obtained.

Accordingly, in the case of a piezoelectric body having the characteristic that current flowing through the piezoelectric body during polarization is increased, for the application of the DC voltage, a voltage drop in a current limiting resistor is calculated based on a current value flowing through the piezoelectric body, and the voltage drop is added to an initial applied voltage.

That is, an applied voltage is determined according to the following calculation expression:

applied voltage=initial voltage+current value×current limiting resistance

By keeping constant the voltage applied to each piezoelectric body at any time, dispersion of the polarization degrees of the piezoelectric bodies, caused by dispersion of the applied voltages, is greatly reduced. According to this method, the polarization condition (voltage) is kept constant in addition to the control of the polarization degree. Therefore, dispersion of the polarization degree is further reduced.

Other features, elements, characteristics and advantages of preferred embodiments of the present invention will become apparent from the detailed description of the preferred embodiments of the present invention with reference to the attached drawings.

DETAILED DESCRIPTION OF PREFERRED EMBODIMENTS

Figure 3:
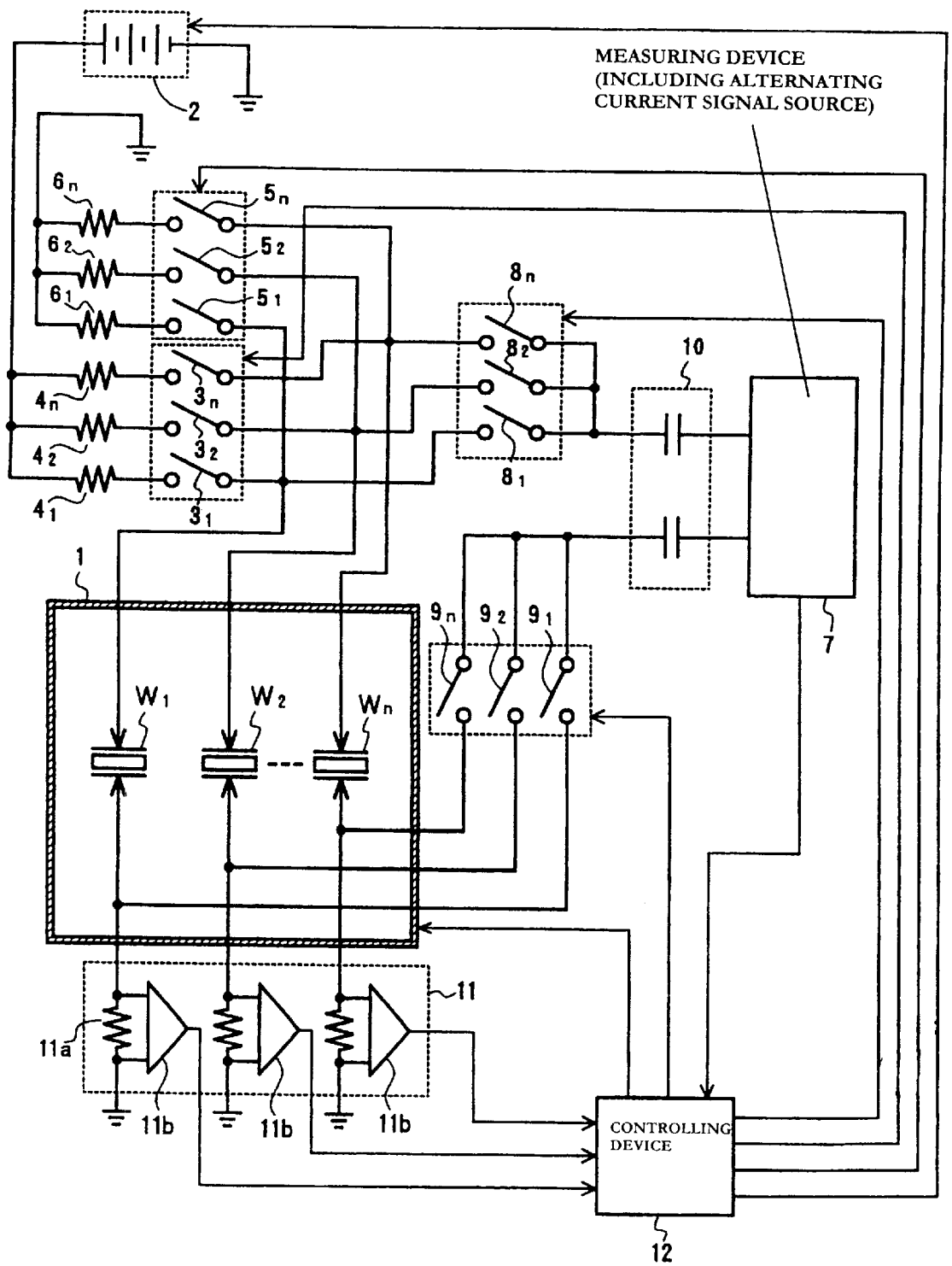
FIG. 3 is a circuit diagram showing an example of a polarization treatment apparatus according to preferred embodiments of the present invention.

FIG. 3 shows an example of a polarization treatment apparatus with which a method of polarization-treating a piezoelectric body according to preferred embodiments of the present invention is carried out.

In FIG. 3, reference numerals $W_1$ to $W_n$ represent a plurality of piezoelectric bodies to be polarization-treated. The polarization treatment apparatus includes a thermostat 1 for accommodating the piezoelectric bodies $W_1$ to $W_n$ and controlling an atmosphere at a predetermined temperature, a high voltage DC source 2 for polarization, high voltage change-over switches $3_1$ to $3_n$ for applying a voltage to the plural piezoelectric bodies $W_1$ to $W_n$, current limiting switches $4_1$ to $4_n$ for preventing over-current, discharge change-over switches $5_1$ to $5_n$ for discharging electric charges from the piezoelectric bodies $W_1$ to $W_n$, discharge resistors $6_1$ to $6_n$, a measuring device 7 for measuring the polarization degrees of the respective piezoelectric bodies $W_1$ to $W_n$ during polarization, measuring switches $8_1$ to $8_n$ and $9_1$ to $9_n$, an AC/DC separation circuit 10 for blocking a DC high voltage during polarization, a current detection circuit 11 for detecting currents flowing through the piezoelectric bodies, and a control device 12 for controlling applied voltages and the polarization degrees.

Figure 4:
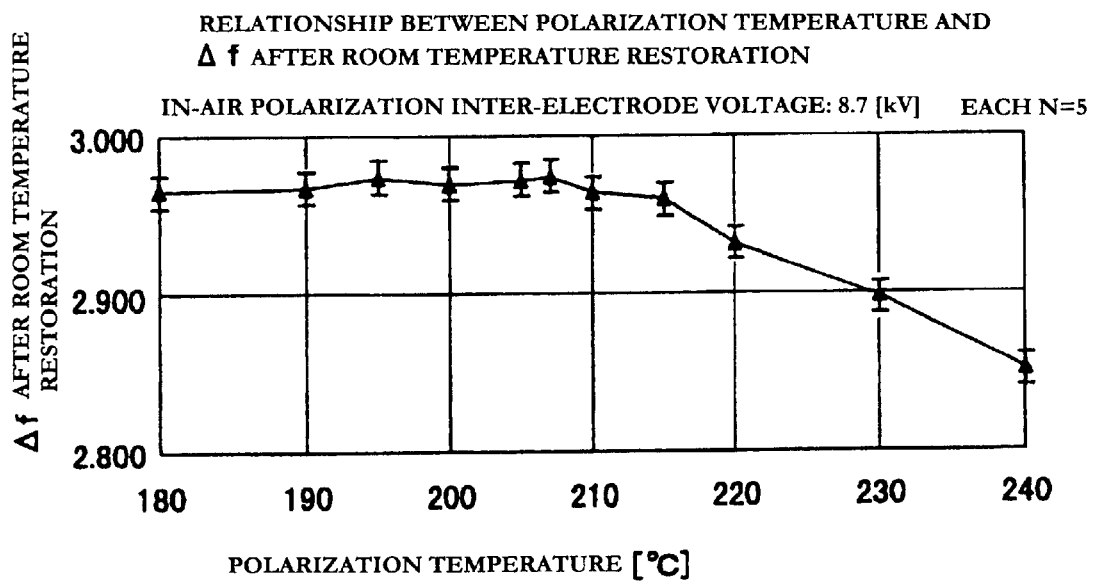
FIG. 4 is a graph showing a relation between the polarization temperature and the polarization degree after ordinary temperature restoration.

In the thermostat 1, the polarization, aging, and ordinary temperature restoration of the piezoelectric bodies $W_1$ to $W_n$ are carried out. The temperature of the thermostat 1 is controlled to be suitable for each treatment by a control device 12. The polarization temperature is preferably higher than an aging temperature and at a temperature at which a polarization degree comparable to that obtained by conventional in-liquid polarization is attained. FIG. 4 shows a relation between the polarization temperature during the in-air polarization and the maximum polarization degree Δf obtained after the ordinary temperature restoration. The conditions were the same as those for the polarization of FIG. 2. In this example, the polarization temperature is defined as the highest possible temperature in the temperature range where no significant difference between the maximum polarization degrees Δf obtained after the in-air polarization and the ordinary temperature restoration is found.

The measuring device 7 includes a network analyzer, for example, and applies AC signals from an AC signal source to the respective piezoelectric bodies $W_1$ to $W_n$, and based on the impedance characteristics, detects the resonance frequencies fr and the anti-resonance frequencies fa, and determines the polarization degrees by use of the frequency differences Δf. Further, the polarization degrees may be determined by use of the electromechanical coupling coefficients K other than the frequency differences Δf.

The current detection circuit 11 includes detection resistors 11a, and amplifiers 11b such as OP amplifiers for detecting potential differences between both ends of the respective resistors 11a. The currents flowing through the respective piezoelectric bodies $W_1$ to $W_n$ are individually detected, based on the potential differences between both ends of the respective resistors 11a. The detection resistors 11a and the amplifiers 11b are connected to the piezoelectric bodies $W_1$ to $W_n$, respectively.

Polarization degree signals from the measuring device 7 and current detection signals from the amplifiers 11b are input to the control device 12. The control device 12 controls the thermostat 1, the high voltage DC source 2, the high voltage change-over switches $3_1$ to $3_n$, the discharge change-over switches $5_1$ to $5_n$, the measuring switches $8_1$ to $8_n$ and $9_1$ to $9_n$, and so forth. After the high voltage change-over switches $3_1$ to $3_n$ are turned ON, the measuring switches $8_1$ to $8_n$ and $9_1$ to $9_n$ are continuously switching-driven for the respective piezoelectric bodies. Of the measuring switches $8_1$ to $8_n$ and $9_1$ to $9_n$, switches connected to each other ($8_1$ and $9_1$), ($8_2$ and $9_2$) ... ($8_n$ and $9_n$) are switched so as to be simultaneously turned ON, respectively. The high voltage change-over switch $3_1$ to $3_n$ and the discharge change-over switches $5_1$ to $5_n$ are alternatively turned ON. During polarization, the high voltage change-over switch $3_1$ to $3_n$ are turned ON, and after the polarization, the discharge change-over switches $5_1$ to $5_n$ are turned ON.

Next, a polarization method according to preferred embodiments of the present invention using the polarization treatment apparatus having the above-described configuration will be described.

First, the piezoelectric bodies $W_1$ to $W_n$ are placed in the thermostat 1. The temperature of the thermostat 1 is controlled so that all the piezoelectric bodies have a predetermined temperature (for example, 200° C.) at least as high as the aging temperature. Next, the high voltage change-over switch $3_1$ to $3_n$ are turned ON, so that DC voltages for polarization are simultaneously applied to all the piezoelectric bodies $W_1$ to $W_n$, respectively. After the voltages start to be applied, the measuring switches $8_1$ to $8_n$ and $9_1$ to $9_n$ are switched so that AC signals for determining the polarization degrees are sequentially fed from the measuring device 7 to the piezoelectric bodies $W_1$ to $W_n$.

Figure 1:
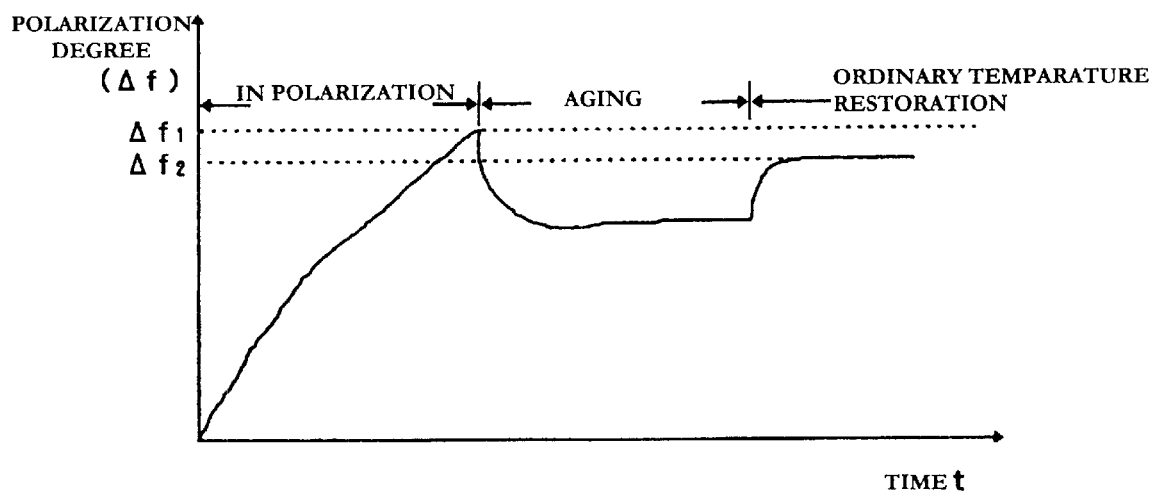
FIG. 1 is a graph showing the variation of the polarization degree of a piezoelectric body in a polarization treatment process.
Figure 2:
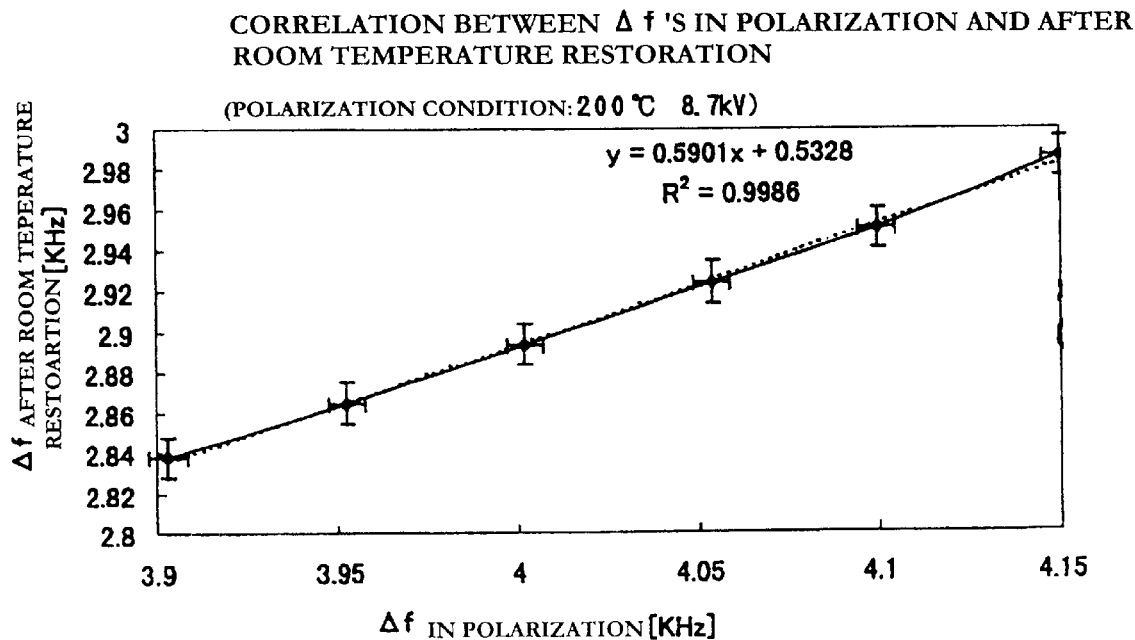
FIG. 2 is a graph showing a correlation between the polarization degree during polarization and that obtained after ordinary temperature restoration.
Figure 5:
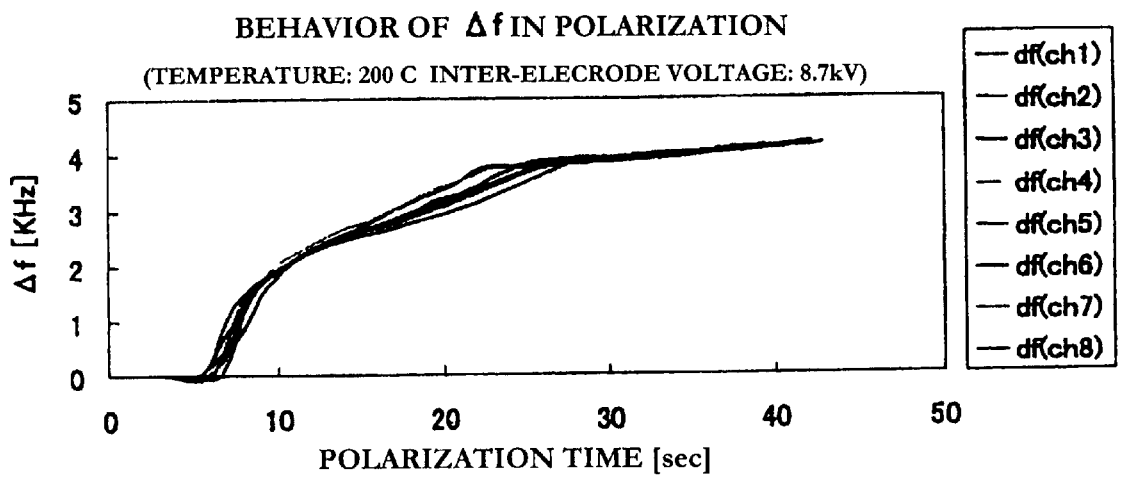
FIG. 5 is a graph showing variations of the polarization degree during polarization.

As the polarization of the piezoelectric bodies $W_1$ to $W_n$ proceeds, the polarization degrees Δf are increased, as shown in FIG. 5. The polarization degrees are measured with the measuring device 7. That is, in the measuring device 7, the resonance frequencies fr of the piezoelectric bodies $W_1$ to $W_n$ and the anti-resonance frequencies fa are measured, and based on the frequency differences Δf, the polarization degrees are individually calculated. In the control device 12, polarization degrees $Δf_1$ during polarization, having a high correlation with the polarization degrees $Δf_2$ which are stable after the ordinary temperature restoration are preset. At the time when each polarization degree during the polarization reaches the set value $Δf_1$, the control device 12 causes the high voltage change-over switches $3_1$ to $3_n$ to be turned OFF, individually, so that the application of the DC voltages to the piezoelectric bodies $W_1$ to $W_n$ is stopped, respectively. For example, as seen in FIG. 2, in order to obtain a target polarization degree $Δf_2$=2.97 kHz, the application of the voltage is stopped at the time when the polarization degree Δf during polarization reaches 4.13 kHz. In case where there is a piezoelectric body of which the polarization degree has not reached the set value $\Delta f_1$ yet, the voltage application to the piezoelectric body is continued until the polarization degree of the piezoelectric body reaches the set value $\Delta f_1$. Simultaneously when the voltage application is stopped, the control device 12 causes the discharge change-over switches $5_1$ to $5_n$ to be turned ON, so that charges stored in the piezoelectric bodies $W_1$ to $W_n$ are discharged. If the discharge is not carried out, an inverse electric field is applied, caused by the charges stored in the piezoelectric bodies $W_1$ to $W_n$. The polarization may be returned. After the discharge, the polarization is completed.

Next, the piezoelectric bodies $W_1$ to $W_n$ are aged in the thermostat 1 while the temperature of the piezoelectric bodies is kept at a temperature (for example, 200° C.) that is substantially equal to or lower than that during the polarization. The aging time is approximately 2 or 3 minutes. During the aging, the discharge change-over switches $5_1$ to $5_n$ are kept in the ON state so that the discharge is continued. Thereafter, the piezoelectric bodies $W_1$ to $W_n$ are taken out from the thermostat 1, and the temperature is restored in a sufficient time. Thus, the polarization treatment is completed.

The piezoelectric bodies $W_1$ to $W_n$ of which the polarization treatment is completed possess a target polarization degree $\Delta f_2$.

In the above-described preferred embodiment, the polarization degrees $\Delta f_1$ having a high correlation with the stable target polarization degrees $\Delta f_2$ obtained after the ordinary temperature restoration are preset, and the application of a voltage to the piezoelectric bodies $W_1$ to $W_n$ is stopped at the time when the polarization degree Δf during polarization reaches the set value $\Delta f_1$. The changes of the polarization degree may be characterized by use of measurements of the polarization degree during polarization, and the time period required for the polarization degree to reach a set level, and the application of a voltage is stopped at the time when the polarization time reaches the calculated time period.

In particular, as shown in FIG. 5, in the behaviors of the polarization degree (Δf) during polarization, a linear variation is exhibited from a halfway polarization. Data during polarization are represented by $y_t, y_{t-1} \ldots y_{t-m}$ in which m is an arbitrary value. According to the linear regression calculation of the data during polarization, an approximation formula y=at+b (y: polarization degree, t: polarization time), and a correlation coefficient $r^2$ are determined. Then, a and b are determined so as to satisfy the discrimination formula $r^2 > c$ (for example c=0.92).

The above data are sequentially updated while the discrimination formula is not satisfied (the number of data is n) . The time $t_0$ required to reach a set level (polarization degree) $y_0$ is calculated from the following formula by use of a and b satisfying the discrimination formula.

$$t_0 = (y_0 - b)/a$$

The application of the DC voltage is stopped at the time when the polarization time reaches the calculated time $t_0$. In the case of plural piezoelectric bodies, the above-described prediction calculation is carried out for each piezoelectric body, and the application of the DC voltage is individually stopped.

In the above-described method, only the polarization time is measured at a time point near the completion of the polarization. It is not needed to measure the polarization degree at the time point when the polarization is completed. Accordingly, excess polarization caused by measurement lag is prevented. Advantageously, the polarization is very precisely controlled.

Figure 6:
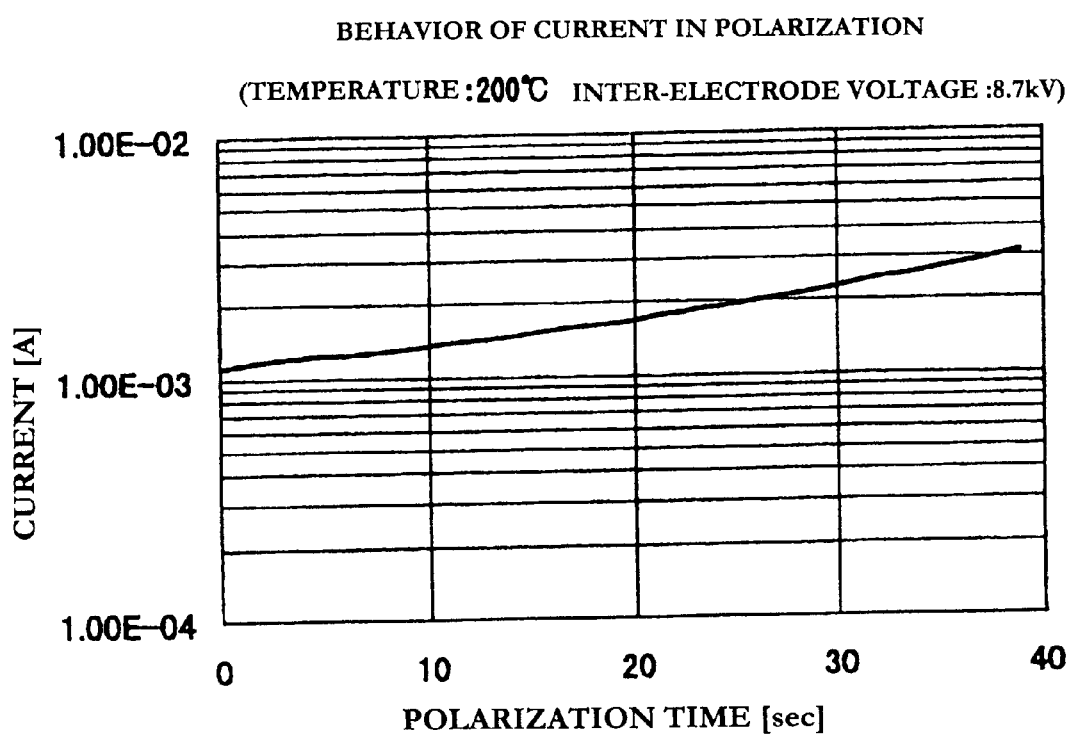
FIG. 6 is a graph showing variations of current during polarization.

In the case where a thick piezoelectric body such as a block-shaped ceramic substrate is polarized, current flowing through the piezoelectric body tends to increase during polarization with as time lapses, as shown in FIG. 6. As the polarization is carried out at a higher temperature, the current increase is more apparent. When currents flowing through piezoelectric bodies are increased during polarization, voltage drop occurs in the current limiting resistors $4_1$ to $4_n$, and the voltages between the electrodes at both ends of the respective piezoelectric bodies $W_1$ to $W_n$ are decreased. The voltage decrease causes a problem in that the polarization rates of the respective piezoelectric bodies $W_1$ to $W_n$ are reduced, and a desired polarization degree cannot be attained.

In the control device 12, the inter-electrode voltages of the piezoelectric bodies are controlled so as to be kept constant at any time by calculating the voltage drops in the current limiting resistors $4_1$ to $4_n$ based on current values detected by the current detection circuit 11, and adding the voltage drops to the initially applied voltages.

That is, each applied voltage is determined according to the following calculation expression.

applied voltage=initial voltage+current value×current limiting resistance

Dispersion of the polarization degrees of the piezoelectric bodies is eliminated by keeping constant the voltages applied to the piezoelectric bodies at any time as described above.

In the case where one applied voltage source 2 is used, as shown in FIG. 3, in order to control the source voltage, the minimum values of currents flowing through the respective piezoelectric bodies is used as the current values required for the above calculation. This is because the piezoelectric bodies are prevented from being broken down, due to application of an overvoltage. On the other hand, in the case where two applied voltage sources are provided, for example, the applied voltages are calculated, based on current values of the respective piezoelectric bodies, and the voltages of the applied voltage sources are controlled for the respective piezoelectric bodies. The voltage control is carried out by feeding back at any time when the current value is being increased.

In the above described preferred embodiment, the polarization and the aging are carried out at 200° C., as an example. The polarization temperature, provided that it is at least as high as the aging temperature, is not restricted to 200° C. In the case of piezoelectric ceramics, the polarization temperatures and the aging temperatures are different, depending upon the material. For the purpose of reducing dispersion of the polarization, the temperature range of from about 180° C. to about 210° C. is preferable.

As seen in the above description, according to the first preferred embodiment of the present invention, a DC voltage is applied to a piezoelectric body for polarization treatment in the air and in an atmosphere with a temperature at least as high as an aging temperature. Accordingly, the polarization proceeds at a lower voltage than that for polarization carried out in a liquid, and a polarization degree comparable to that by the in-liquid polarization is obtained. The aging proceeds simultaneously with the polarization. Thus, the aging time after the application of the voltage is stopped is greatly shortened. Further, with the polarization degree of the piezoelectric body being measured during the polarization, the application of the DC voltage is stopped at the time when the measured polarization degree reaches a set level, and thereafter, the aging is carried out at the aging temperature. Therefore, dispersion of the polarization degree is substantially reduced, and a target polarization degree is very precisely attained.

In the method according to the third preferred embodiment of the present invention, as well as in the method according to the first preferred embodiment of the present invention, the polarization time and the aging time are significantly shortened. In addition, the changes of the polarization degree are expressed as a characteristic formula, based on measured polarization degrees. The time when the polarization will be completed is predicted according to the characteristic formula. Therefore, it is necessary only to measure the polarization time at a time point near the completion of the polarization. Advantageously, over-polarization, caused by measurement lag, is prevented, and the polarization is very precisely controlled.

It should be understood that the foregoing description is only illustrative of the present invention. Various alternatives and modifications can be devised by those skilled in the art without departing from the invention. Accordingly, the present invention is intended to embrace all such alternatives, modifications and variances that fall within the scope of the appended claims.

What is claimed is:

1. A method of polarization-treating a piezoelectric body, comprising the steps of:
    applying a DC voltage to the piezoelectric body for polarization in the air and in an atmosphere with a temperature at least as high as an aging temperature;
    measuring a polarization degree of the piezoelectric body while the DC voltage is being applied;
    stopping the application of the DC voltage at the time when the measured polarization degree reaches a set level; and
    aging the piezoelectric body at said aging temperature after the application of the DC voltage is stopped.

2. A method of polarization-treating a piezoelectric body according to claim 1, wherein said set level is determined based on a correlation between the polarization degree of the piezoelectric body obtained immediately before the application of the DC voltage is stopped, and the stable polarization degree of the piezoelectric body obtained after the application of the DC voltage is stopped so that the piezoelectric body is aged and the temperature of the piezoelectric body is restored to an ordinary temperature.

3. A method of polarization-treating a piezoelectric body according to claim 1, wherein current flowing through the piezoelectric body is increased during polarization and a voltage drop is calculated based on a current value flowing through the piezoelectric body, and the voltage drop is added to an initial applied voltage.

4. A method of polarization-treating a piezoelectric body according to claim 2, wherein the current flowing through the piezoelectric body is increased during polarization, and a voltage drop is calculated based on a current value flowing through the piezoelectric body, and the voltage drop is added to an initial applied voltage.

5. A method of polarization-treating a piezoelectric body according to claim 1, wherein the DC voltage applied to the piezoelectric body is less than 1 kV/mm.

6. A method of polarization-treating a piezoelectric body according to claim 1, wherein the step of aging the piezoelectric body is conducted for approximately 2 to 3 minutes.

7. A method of polarization-treating a piezoelectric body, comprising the steps of:
    applying a DC voltage to the piezoelectric body for polarization in the air and in an atmosphere with a temperature at least as high as an aging temperature;
    measuring a polarization degree of the piezoelectric body while the piezoelectric body is polarized;
    expressing behaviors of the polarization degree as a characteristic formula, based on measured polarization degrees;
    calculating the time required for the polarization degree to reach a set level;
    stopping the application of the DC voltage at the time when the polarization time reaches the calculated time, and
    aging the piezoelectric body at said aging temperature after the application of the DC voltage is stopped.

8. A method of polarization-treating a piezoelectric body according to claim 7, wherein the current flowing through the piezoelectric body is increased during polarization, and a voltage drop is calculated based on a current value flowing through the piezoelectric body, and the voltage drop is added to an initial applied voltage.

9. A method of polarization-treating a piezoelectric body according to claim 7, wherein the DC voltage applied to the piezoelectric body is less than 1 kV/mm.

10. A method of polarization-treating a piezoelectric body according to claim 7, wherein the step of aging the piezoelectric body is conducted for approximately 2 to 3 minutes.

11. A method of polarization-treating a piezoelectric body, comprising the steps of:
    providing a piezoelectric body;
    polarization-treating the piezoelectric body;
    measuring the polarization degree of the piezoelectric body during the polarization-treating; and
    stopping the polarization-treating when the degree of the polarization reaches a set level; wherein
    the step of polarization treating includes the step of applying a DC voltage to the piezoelectric body for polarization in an atmosphere with a temperature at least as high as an aging temperature.

12. The method according to claim 11, further comprising the step of aging the piezoelectric body at said aging temperature after the application of the DC voltage is stopped.

13. A method of polarization-treating a piezoelectric body, comprising the steps of:
    providing a piezoelectric body;
    polarization-treating the piezoelectric body;
    measuring the polarization degree of the piezoelectric body during the polarization-treating; and
    stopping the polarization-treating when the degree of the polarization reaches a set level; wherein
    said set level is determined based on a correlation between the polarization degree of the piezoelectric body obtained immediately before the application of the DC voltage is stopped, and the stable polarization degree of the piezoelectric body obtained after the application of he DC voltage is stopped so that the piezoelectric body is aged and the temperature of the piezoelectric body is restored to an ordinary temperature.

14. The method according to claim 11, wherein current flowing through the piezoelectric body is increased during polarization and a voltage drop is calculated based on a current value flowing through the piezoelectric body, and the voltage drop is added to an initial applied voltage.

15. The method according to claim 11, wherein the current flowing through the piezoelectric body is increased during polarization, and a voltage drop is calculated based on a current value flowing through the piezoelectric body, and the voltage drop is added to an initial applied voltage.

16. The method according to claim 11, wherein the DC voltage applied to the piezoelectric body is less than 1 kV/mm.

17. The method according to claim 12, wherein the step of aging the piezoelectric body is conducted for approximately 2 to 3 minutes.

* * * * *